(12) United States Patent
Yahata

(10) Patent No.: US 10,804,451 B2
(45) Date of Patent: Oct. 13, 2020

(54) SEMICONDUCTOR LIGHT-EMITTING DEVICE AND PRODUCTION METHOD THEREFOR

(71) Applicant: TOYODA GOSEI CO., LTD., Kiyosu-shi (JP)

(72) Inventor: Kosuke Yahata, Chiba (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 16/169,721

(22) Filed: Oct. 24, 2018

(65) Prior Publication Data

US 2019/0131503 A1 May 2, 2019

(30) Foreign Application Priority Data

Oct. 26, 2017 (JP) .................................. 2017-206868

(51) Int. Cl.
| | |
|---|---|
| *H01L 33/62* | (2010.01) |
| *H01L 33/10* | (2010.01) |
| *H01L 33/42* | (2010.01) |
| *H01L 33/20* | (2010.01) |
| *H01L 33/46* | (2010.01) |
| *H01L 33/32* | (2010.01) |
| *H01L 33/38* | (2010.01) |

(52) U.S. Cl.
CPC .............. *H01L 33/62* (2013.01); *H01L 33/10* (2013.01); *H01L 33/20* (2013.01); *H01L 33/42* (2013.01); *H01L 33/46* (2013.01); *H01L 33/32* (2013.01); *H01L 33/382* (2013.01); *H01L 2933/0025* (2013.01); *H01L 2933/0058* (2013.01)

(58) Field of Classification Search
CPC .......................... H01L 33/20–22; H01L 33/46
See application file for complete search history.

(56) References Cited

U.S. PATENT DOCUMENTS

| 2017/0108937 A1* | 4/2017 | Kim ....................... G06F 1/1662 |
| 2019/0237626 A1* | 8/2019 | Yoon ....................... H01L 33/46 |

FOREIGN PATENT DOCUMENTS

| JP | 3531475 B2 | 5/2004 |
| JP | 5082504 B2 | 11/2012 |
| JP | 2014-053593 A | 3/2014 |

\* cited by examiner

*Primary Examiner* — Jamie C Niesz
(74) *Attorney, Agent, or Firm* — McGinn IP Law Group, PLLC

(57) ABSTRACT

To provide a semiconductor light-emitting device with a multilayer film hardly peeled therefrom and a production method therefor. The light-emitting device has an uneven substrate having an uneven shape on a first surface, a first conduction type first semiconductor layer on the uneven shape of the uneven substrate, a light-emitting layer on the first semiconductor layer, a second conduction type second semiconductor layer on the light-emitting layer, and a third DBR covering at least a part of the first semiconductor layer, the light-emitting layer, and the second semiconductor layer. The light-emitting device is of a flip-chip type. In the periphery of the uneven substrate, the uneven shape has an exposed portion exposed without being covered by the first semiconductor layer. The third DBR covers at least a part of the exposed portion of the uneven shape.

11 Claims, 3 Drawing Sheets

SEMICONDUCTOR LIGHT-EMITTING DEVICE AND PRODUCTION METHOD THEREFOR

BACKGROUND OF THE INVENTION

Filed of the Invention

The present techniques relate to a flip-chip type semiconductor light-emitting device, and a production method therefor.

Background Art

In a semiconductor light-emitting device, light is emitted through recombination of electrons and holes in a well layer of the light-emitting layer. The light emitted from the light-emitting layer advances toward a substrate side direction, a direction opposite to the substrate side, and other directions. Therefore, the semiconductor light-emitting device includes a face-up type light-emitting device having a light extraction surface on the side opposite to the substrate, and a flip-chip type light-emitting device having a light extraction surface on the transparent substrate side. Some flip-chip type light-emitting devices have a reflective layer on the surface opposite to the substrate side to reflect the light directed toward the surface opposite to the substrate side. Japanese Patent Application Laid-Open (kokai) No. 2014-053593 discloses a flip-chip type semiconductor light-emitting device having a multiple reflective film 8 on a transparent electrode 5 (refer to FIG. 2).

Such a multiple reflective film (distributed bragg reflector: DBR) is often formed on a transparent electrode or a p-type semiconductor layer. However, such a multiple reflective film may be peeled from the semiconductor light-emitting device.

SUMMARY OF THE INVENTION

The present techniques have been conceived for solving the aforementioned problems involved in conventional techniques. Thus, an object of the present techniques is to provide a semiconductor light-emitting device with a multiple reflective film hardly peeled therefrom and a production method therefor.

In a first aspect of the present techniques, there is provided a semiconductor light-emitting device, the light-emitting device comprising an uneven substrate having an uneven shape on a first surface thereof, a first conduction type first semiconductor layer on the uneven shape of the uneven substrate, a light-emitting layer on the first semiconductor layer, a second conduction type second semiconductor layer on the light-emitting layer, and a DBR covering at least a part of the first semiconductor layer, the light-emitting layer, and the second semiconductor layer. The semiconductor light-emitting device is of a flip-chip type. In an outer periphery of the uneven substrate, the uneven shape has an exposed portion exposed without being covered by the first semiconductor layer. The DBR covers at least a part of the exposed portion of the uneven shape.

In this semiconductor light-emitting device, the DBR is hardly peeled from the semiconductor light-emitting device. It is because the DBR covers a part of the uneven shape of the uneven substrate. The DBR is strongly adhered to the uneven shape of the uneven substrate by anchor effect. This semiconductor light-emitting device has high emission extraction efficiency because the multiple reflective film covers the side surfaces of the n-type semiconductor layer.

The present specification provides a semiconductor light-emitting device with a multiple reflective film hardly peeled therefrom and a production method therefor.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
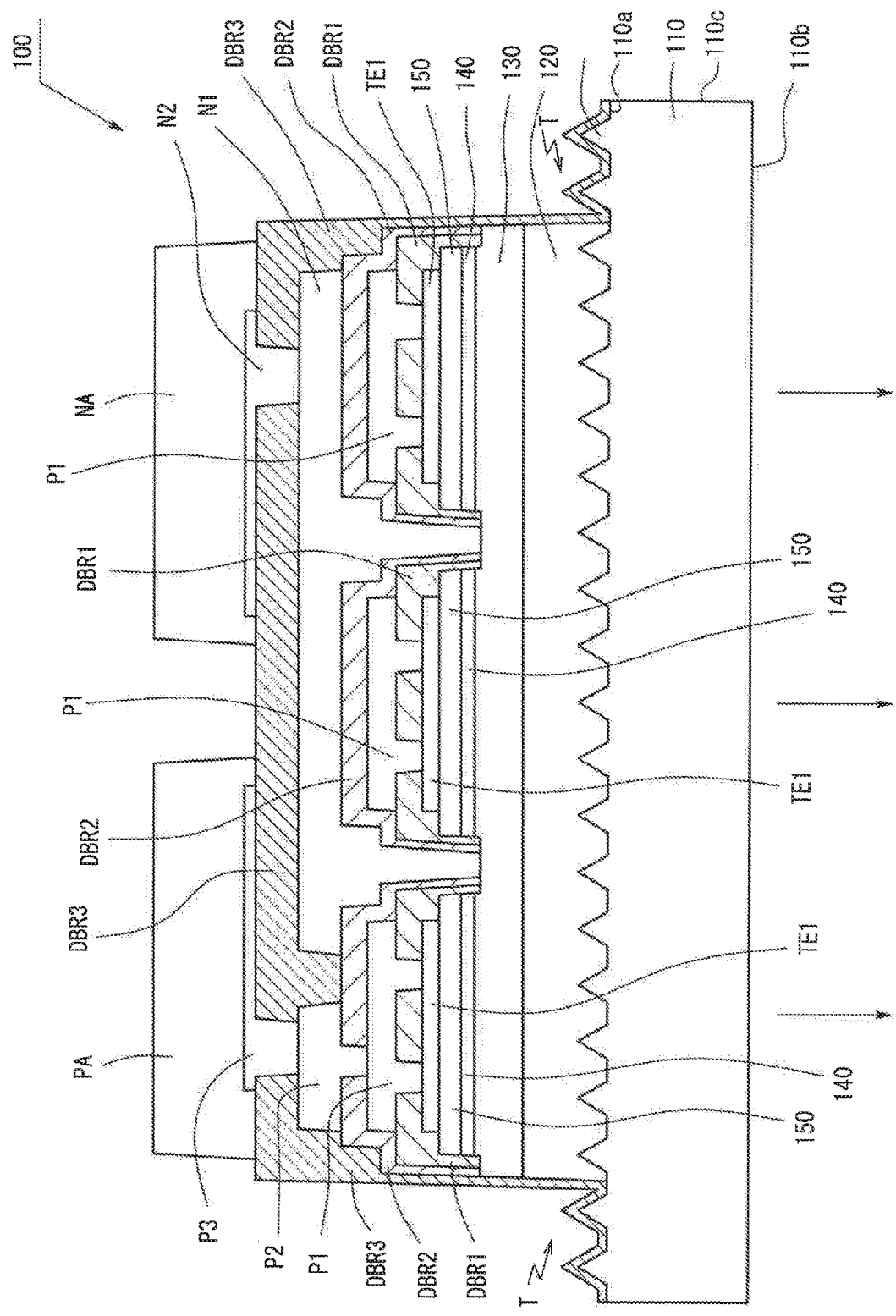
FIG. 1 is a schematic view of the structure of a semiconductor light-emitting device according to a first embodiment.

With reference to the drawings, specific embodiments of the semiconductor light-emitting device of the present technique and the production method therefor will next be described in detail. However, these embodiments should not be construed as limiting the technique thereto. The below-described depositing structure of the layers of the semiconductor light-emitting device and the electrode structure are given only for the illustration purpose, and other depositing structures differing therefrom may also be employed. The thickness of each of the layers shown in the drawings is not an actual value, but a conceptual value.

FIRST EMBODIMENT

1. Semiconductor Light-Emitting Device

FIG. 1 shows a schematic view of the structure of a light-emitting device 100 according to a first embodiment. The light-emitting device 100 is a flip-chip type semiconductor light-emitting device.

As shown in FIG. 1, the light-emitting device 100 has an uneven substrate 110 having protrusions and/or recesses, a base layer 120, a first semiconductor layer 130, a light-emitting layer 140, a second semiconductor layer 150, a transparent electrode TE1, a p-contact electrode P1, a first p-wiring electrode P2, a second p-wiring electrode P3, a p-pad electrode PA, an n-contact electrode N1, an n-wiring electrode N2, an n-pad electrode NA, a first distributed bragg reflector DBR1, a second distributed bragg reflector DBR2, and a third distributed bragg reflector DBR3.

The uneven substrate 110 has a first surface 110a and a second surface 110b. The first surface 110a is a main surface for forming a semiconductor layer thereon. The second surface 110b is a surface for extracting light from the light-emitting device 100 to the outside. The first surface 110a of the uneven substrate 110 has an uneven shape 111, i.e., concave and convex. Semiconductor layers are formed on the uneven shape 111. An uneven shape may be formed on the second surface 110b as well.

The base layer 120 is a semiconductor layer formed on the uneven shape 111 on the first surface 110a of the uneven substrate 110. The base layer 120 is formed of, for example, i-GaN. The base layer 120 may include a buffer layer on the uneven shape 111 of the uneven substrate 110. The base layer 120 has a flat surface. However, the base layer 120 may have an uneven surface.

The first semiconductor layer 130 is a first conduction type semiconductor layer. The first semiconductor layer 130 is disposed on a layer higher than the uneven shape 111 of the uneven substrate 110. The first semiconductor layer 130 includes, for example, an n-type contact layer, an n-side electrostatic breakdown preventing layer, and an n-side superlattice layer. The n-type contact layer is a layer in contact with the n-contact electrode N1. The first semiconductor layer 130 may have any structure other than the above. For example, the first semiconductor layer 130 may include an undoped semiconductor layer.

The light-emitting layer 140 is a semiconductor layer that emits light through recombination of holes and electrons. The light-emitting layer 140 is formed on the first semiconductor layer 130. The light-emitting layer 140 has a well layer and a barrier layer. The light-emitting layer 140 has a single quantum well structure or a multi-quantum well structure.

The second semiconductor layer 150 is a second conduction type semiconductor layer. The second semiconductor layer 150 is formed on the light-emitting layer 140. The second semiconductor layer 150 includes, for example, a p-side superlattice layer and a p-type contact layer. The p-type contact layer is electrically connected to a p-contact electrode P1. The second semiconductor layer 150 may have any structure other than the above. For example, the second semiconductor layer 150 may include an undoped semiconductor layer.

The transparent electrode TE1 is formed on the p-type contact layer of the second semiconductor layer 150. The transparent electrode TE1 is made of ITO. Any transparent conductive oxide such as IZO, ICO, ZnO, $TiO_2$, $NbTiO_2$, and $TaTiO_2$ may be used other than ITO.

The p-contact electrode P1 is formed on the transparent electrode TE1. The p-contact electrode P1 is electrically connected to the p-type contact layer of the second semiconductor layer 150 via the transparent electrode TE1. The p-contact electrode P1 is a metal electrode including at least one metal layer selected from a group consisting of, for example, Ta, Ti, Pt, Ni, Au, Ag, Co, and In.

The first p-wiring electrode P2 is formed on the p-contact electrode P1. The first p-wiring electrode P2 is electrically connected to the p-type contact layer of the second semiconductor layer 150 via the p-contact electrode P1 and the transparent electrode TE1. The first p-wiring electrode P2 is a metal electrode including at least one metal layer selected from a group consisting of, for example, Ta, Ti, Pt, Ni, Au, Ag, Co, and In.

The second p-wiring electrode P3 is formed on the first p-wiring electrode P2. The second p-wiring electrode P3 is electrically connected to the p-type contact layer of the second semiconductor layer 150 via the first p-wiring electrode P2, the p-contact electrode P1, and the transparent electrode TE1. The second p-wiring electrode P3 is a metal electrode including at least one metal layer selected from a group consisting of, for example, Ti, Pt, Ni, Au, Ag, Co, and In.

The p-pad electrode PA is formed on the second p-wiring electrode P3. The p-pad electrode PA is electrically connected to the p-type contact layer of the second semiconductor layer 150 via layers from the second p-wiring electrode P3 to the transparent electrode TE1. The p-pad electrode PA is a metal electrode including at least one metal layer selected from a group consisting of, for example, Ni, Au, Sn, Ag, Co, and In.

The n-contact electrode N1 is formed on the first semiconductor layer 130. The n-contact electrode N1 is in contact with the n-type contact layer of the first semiconductor layer 130. Therefore, needless to say, the re-contact electrode N1 is electrically connected to the n-type contact layer of the first semiconductor layer 130. The re-contact electrode N1 is a metal electrode including at least one metal layer selected from a group consisting of, for example, Ti, Al, Pt, Ta, Ni, Au, Ag, Co, and In.

The n-wiring electrode N2 is formed on the n-contact electrode N1. The n-wiring electrode N2 is in contact with the n-contact electrode N1. Therefore, the n-wiring electrode N2 is electrically connected to the n-type contact layer of the first semiconductor layer 130. The n-wiring electrode N2 is a metal electrode including at least one metal layer selected from a group consisting of, for example, Ti, Pt, Ni, Au, Ag, Co, and In.

The n-pad electrode NA is formed on the n-wiring electrode N2. The n-pad electrode NA is in contact with the n-wiring electrode N2. Therefore, the n-pad electrode NA is electrically connected to the n-type contact layer of the first semiconductor layer 130. The n-pad electrode NA is a metal electrode including at least one metal layer selected from a group consisting of, for example, Ni, Sn, Au, Ag, Co, and In.

The first distributed bragg reflector DBR1, the second distributed bragg reflector DBR2, and the third distributed bragg reflector DBR3 will be described later.

2. Distributed Bragg Reflector (DBR)

2-1. Structure of DBR

The first distributed bragg reflector DBR1, the second distributed bragg reflector DBR2, and third distributed bragg reflector DBR3 are, needless to say, a DBR reflecting the light emitted from the light-emitting layer 140. The first distributed bragg reflector DBR1, the second distributed bragg reflector DBR2, and the third distributed bragg reflector DBR3 are, for example, an insulating multilayer film formed by repeatedly forming $SiO_2$ and $TiO_2$ films. Any material other than the above may be used.

The first distributed bragg reflector DBR1 covers the transparent electrode TE1 and the semiconductor layers except for the contact portion between the transparent electrode TE1 and the p-contact electrode P1, and except for the contact portion between n-contact electrode N1 and the first semiconductor layer 130. Specifically, the first distributed bragg reflector DBR1 covers the surface of the transparent electrode TE1 and the periphery region of the upper surface of the second semiconductor layer 150, the side surface of the second semiconductor layer 150, the side surface of the light-emitting layer 140, and a part of the side surface of the first semiconductor layer 130. Needless to say, the first distributed bragg reflector DBR1 may cover the portion other than the above. That is, the first distributed bragg reflector DBR1 covers at least a part of the first semiconductor layer 130, the light-emitting layer 140, and the second semiconductor layer 150. However, the first distributed bragg reflector DBR1 does not cover the side surfaces 110c of the uneven substrate 110.

The second distributed bragg reflector DBR2 is for insulating the p-contact electrode P1 and the n-contact electrode N1. Therefore, the second distributed bragg reflector DBR2 covers the first distributed bragg reflector DBR1 and the p-contact electrode P1 except for the contact portion between the p-contact electrode P1 and the first p-wiring electrode P2, and except for the contact portion between n-contact electrode N1 and the first semiconductor layer 130. That is, the second distributed bragg reflector DBR2 covers the periphery region of the upper surface of the second semiconductor layer 150, the side surface of the second semiconductor layer 150, the side surface of the light-emitting layer 140a, and a part of the side surface of the first semiconductor layer 130 via the first distributed bragg reflector DBR1. However, the second distributed bragg reflector DBR2 does not cover the side surfaces 110c of the uneven substrate 110.

The third distributed bragg reflector DBR3 is for insulating the p-type conduction system including the first p-wiring electrode P2 and the second p-wiring electrode P3 and the n-type conduction system including the n-contact electrode N1 and the n-wiring electrode N2. Therefore, third distributed bragg reflector DBR3 covers a part of the second distributed bragg reflector DBR2, the first wiring electrode P2, and the n-contact electrode N1 except for the contact portion between the first wiring electrode P2 and the second wiring electrode P3, and except for the contact portion between the n-contact electrode N1 and the n-wiring electrode N2. That is, the third distributed bragg reflector DBR3 covers the side surface of the base layer 120 and a part of the side surface of the first semiconductor layer 130. Only the third distributed bragg reflector DBR3 among the first, second, and third distributed bragg reflectors DBR1, DBR2, and DBR3 is contacted with the side surface of the base layer 120 and a part of the side surface of the first semiconductor layer 130. The side surface is also a part of a side surface of an isolation trench T which divides respective light-emitting devices. And also the third distributed bragg reflector DBR3 covers the light-emitting layer 140 and the second semiconductor layer 150 via the first distributed bragg reflector DBR1 and the second distributed bragg reflector DBR2. However, the third distributed bragg reflector DBR3 does not cover the side surfaces 110c of the uneven substrate 110. The third distributed bragg reflector DBR3 covers the outer periphery of the first surface 110a of the uneven substrate 110.

Figure 2:
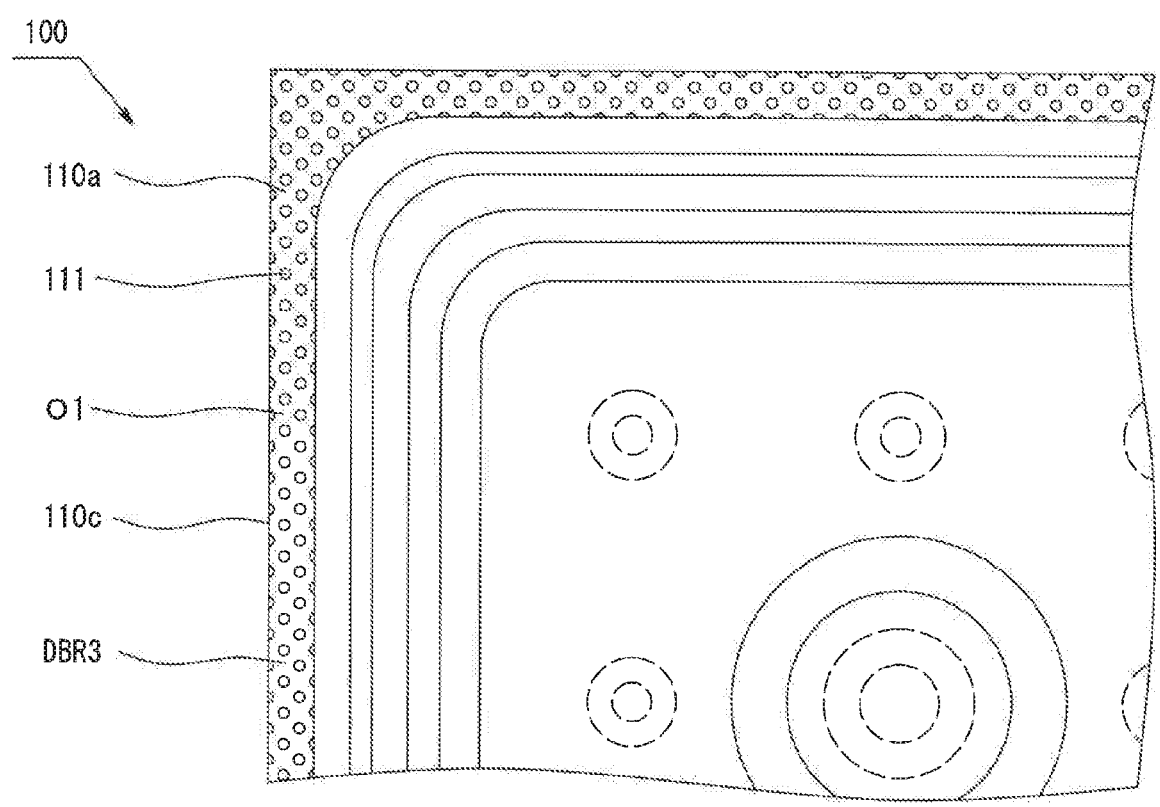
FIG. 2 is a top view viewed from an electrode side of the semiconductor light-emitting device according to the first embodiment.

FIG. 2 is a top view viewed from the electrode side of the light-emitting device 100. As shown in FIG. 2, in the outer periphery O1 of the first surface 110a of the uneven substrate 110, the uneven shape 111 is not covered by the semiconductor layer. In the outer periphery O1 of the uneven substrate 110, the uneven shape 111 is covered by only the third distributed bragg reflector DBR3. That is, only the third distributed bragg reflector DBR3 is contacted with an entire region of the outer periphery O1 of the uneven substrate 110.

Figure 3:
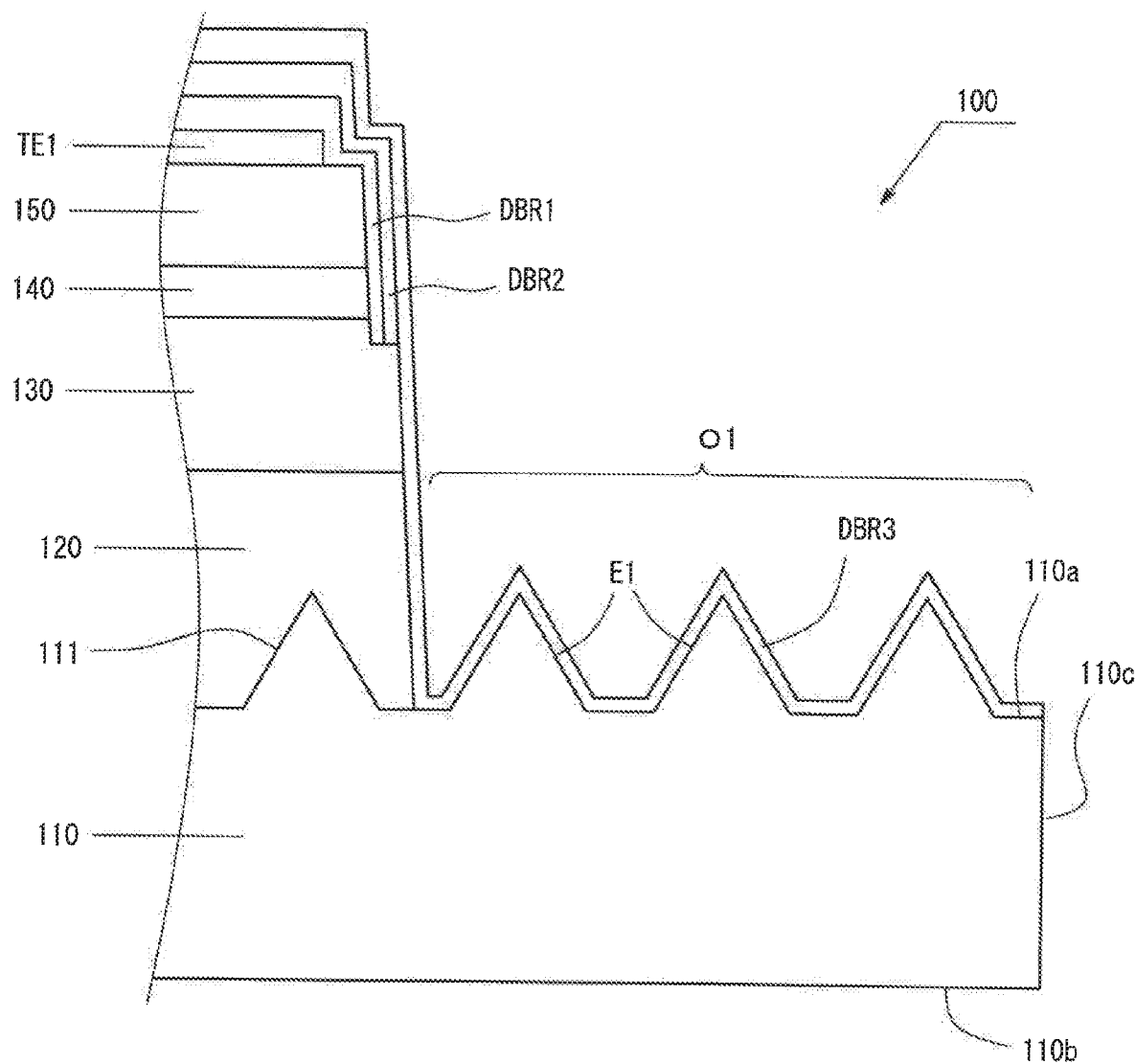
FIG. 3 is a cross-sectional view showing the periphery of an uneven substrate of the semiconductor light-emitting device according to the first embodiment.

FIG. 3 is a cross-sectional view showing the periphery of an uneven substrate 110 of the light-emitting device 100. As shown in FIG. 3, in the periphery O1 of the uneven substrate 110, the uneven shape 111 is exposed without being covered by the base layer 120. The uneven shape 111 has an exposed portion E1 exposed without being covered by the semiconductor layer in the periphery O1. The third distributed bragg reflector DBR3 covers at least a part of the exposed portion E1 of the uneven shape 111 of the uneven substrate 110. That is, actually, the entire portion of the exposed portion E1 is covered not by the semiconductor layer but by the third distributed bragg reflector DBR3. The third distributed bragg reflector DBR3 is formed along the protrusions/recesses of the uneven shape 111.

The pitch interval of the protrusions of the uneven shape 111 is, for example, 1 μm to 5 μm. The height of the protrusions on the uneven shape 111 is, for example, 1 μm to 5 μm. The width of the periphery O1 is, for example, 5 μm to 15 μm. The width of the periphery O1 is preferably two times to ten times the pitch interval of the protrusions of the uneven shape 111, thereby achieving high adhesion between the third distributed bragg reflector DBR3 and the uneven shape 111. The thickness of the third distributed bragg reflector DBR3 is, for example, 1 μm to 5 μm.

2-2. Effect of DBR

The third distributed bragg reflector DBR3 covers the uneven shape 111 of the uneven substrate 110. The third distributed bragg reflector DBR3 exerts the anchor effect at the uneven shape 111. Therefore, the third distributed bragg reflector DBR3 is closely adhered to the uneven substrate 110. Thereby, the third distributed bragg reflector DBR3 is hardly peeled from the uneven substrate 110.

The third distributed bragg reflector DBR3 covers the outer periphery of the first surface 110a of the uneven substrate 110 and the side surfaces of the element except for the side surfaces 110c of the uneven substrate 110. Therefore, the light emitted from the light-emitting layer 140 is reflected by the DBR including the third distributed bragg reflector DBR3. Thereby, more light is extracted from the second surface 110b as the light extraction surface.

The light-emitting device 100 has the first distributed bragg reflector DBR1. The first distributed bragg reflector DBR1 reflects the light emitted from the light-emitting layer 140 to the second surface 110b (light extraction surface) side before the light emitted from light-emitting layer 140 is absorbed by the metal electrode such as p-contact electrode P1. Thereby, the light-emitting device 100 is sufficiently bright.

3. Method for Producing Semiconductor Light-Emitting Device

The production method comprises the steps of preparing an uneven substrate having an uneven shape on a first surface, forming a first conduction type first semiconductor layer on the uneven shape of the uneven substrate, forming a light-emitting layer on the first semiconductor layer, forming a second conduction type second semiconductor layer on the light-emitting layer, forming a DBR covering at least a part of the first semiconductor layer, the light-emitting layer, and the second semiconductor layer.

Examples of the carrier gas employed include hydrogen ($H_2$), nitrogen ($N_2$), and a mixture of hydrogen and nitrogen ($H_2+N_2$). In the steps being described later, unless otherwise specified, any of these may be employed. Ammonia gas ($NH_3$) is used as a nitrogen source. Trimethylgallium (Ga($CH_3$)$_3$: "TMG") is used as a gallium source. Trimethylaluminum (Al($CH_3$)$_3$: "TMA") is used as an aluminum source. Trimethylindium (In($CH_3$)$_3$: "TMI") is used as an indium source. Silane ($SiH_4$) is used as an n-type dopant gas. Bis(cyclopentadienyl)magnesium (Mg($C_5H_5$)$_2$) is used as a p-type dopant gas.

3-1. Substrate Preparation Step

Firstly, an uneven substrate 110 is prepared. The uneven substrate 110 has a first surface 110a and a second surface 110b. An uneven shape 111 is formed on the first surface 110a of the uneven substrate 110. For example, the uneven substrate 110 is disposed on a susceptor in a chamber of a MOCVD furnace.

3-2. Substrate Washing Step

Subsequently, the substrate temperature is heated up to a temperature of 1,000° C. or more. Hydrogen gas is supplied into the chamber. Thereby, the first surface 110a of the uneven substrate 110 is washed and reduced.

3-3. Base Layer Formation Step

Next, a buffer layer is formed on the first surface 110a of the uneven substrate 110. A base layer 120 is formed on the buffer layer. The base layer 120 fills in the uneven shape 111 of the uneven substrate 110. The surface of the base layer 120 is relatively flat. The buffer layer is, for example, a low temperature growth AlN layer or a low temperature growth GaN layer. The base layer 120 is, for example, an i-GaN layer. The above are only examples, and any layer other than the above may be used.

3-4. First Semiconductor Layer Formation Step

A first semiconductor layer 130 is formed on the base layer 120. That is, a first conduction type first semiconductor layer 130 is formed on the uneven shape 111 of the uneven substrate 110. For example, on the base layer 120, semiconductor layers are formed in the order of an n-type contact layer, an n-side electrostatic breakdown preventing layer, and an n-side superlattice layer. The substrate temperature in this step is within a range of 900° C. to 1,200° C.

3-5. Light-Emitting Layer Formation Step

A light-emitting layer 140 is formed on the first semiconductor layer 130. In this step, a barrier layer and a well layer are alternately deposited. The temperature substrate is within a range of 900° C. to 1,200° C.

3-6. Second Semiconductor Layer Formation Step

A second conduction type second semiconductor layer 150 is formed on the light-emitting layer 140. For example, on the light-emitting layer 140, semiconductor layers are formed in the order of a p-side superlattice layer and a p-type contact layer. The substrate temperature in this step is within a range of 800° C. to 1,200° C.

3-7. Transparent Electrode Formation Step

A transparent electrode TE1 is formed on the second semiconductor layer 150. Specifically, a transparent electrode TE1 is formed on the p-type contact layer of the second semiconductor layer 150. The technique of formation may be sputtering or vapor deposition.

3-8. Recess Formation Step

A part of the n-type contact layer of the first semiconductor layer 130 is exposed. The exposed portion is for forming the n-contact electrode N1.

3-9. First Distributed Bragg Reflector Formation Step (First Insulating Film Formation Step)

A first distributed bragg reflector DBR1 is formed on the transparent electrode TE1. The technique of formation may be sputtering or vapor deposition.

3-10. P-Contact Electrode Formation Step

A p-contact electrode P1 a part of which is contacted with the transparent electrode TE1 is formed on the first distributed bragg reflector DBR1. At this stage, the surface of the transparent electrode TE1 is covered by the first distributed bragg reflector DBR1. Therefore, windows are formed in the first distributed bragg reflector DBR1 by etching using a mask. The windows are a contact region of the p-contact electrode P1 and the transparent electrode TE1. The contact region of the transparent electrode TE1 is exposed. A p-contact electrode P1 is uniformly formed on the first distributed bragg reflector DBR1 to be contacted with the exposed portion of the transparent electrode TE1.

3-11. Second Distributed Bragg Reflector Formation Step (Second Insulating Film Formation Step)

A second distributed bragg reflector DBR2 is formed on the p-contact electrode P1. The technique of formation may be sputtering or vapor deposition.

3-12. n-Contact Electrode Formation Step

An n-contact electrode N1 a part of which is contacted with the first semiconductor layer 130 is formed on the second distributed bragg reflector DBR2. At this stage, the first distributed bragg reflector DBR1 and the second distributed bragg reflector DBR2 cover the surface of a contact region of the n-type contact layer in the first semiconductor layer 130. Windows are formed in a laminated layer of the first distributed bragg reflector DBR1 and the second distributed bragg reflector DBR2 by etching using a mask. Thereby, the contact region of the n-type contact layer in the first semiconductor layer 130 is exposed. An n-contact electrode N1 is uniformly formed on the second distributed bragg reflector DBR2 to be contacted with the contact region of the n-type contact layer in the first semiconductor layer 130.

3-13. First p-Wiring Electrode Formation Step

A first p-wiring electrode P2 a part of which is contacted with the p-contact electrode P1 is formed on the second distributed bragg reflector DBR2. For that purpose, a part of the second distributed bragg reflector DBR2 is removed to thereby expose a contact region of the p-contact electrode P1 and the first p-wiring electrode P2. In the above n-contact electrode formation step, the second distributed bragg reflector DBR2 may be removed in the contact region of the first p-wiring electrode P2. A first p-wiring electrode P2 is uniformly formed on the second distributed bragg reflector DBR2 to be contacted with the exposed contact region of p-contact electrode P1.

3-14. Element Isolation Step (Uneven Shape Exposure Step)

The semiconductor layers on the uneven substrate 110 are isolated by isolation trenches into chip size sections. For that purpose, etching may be used. A part of the base layer 120, the first semiconductor layer 130, the light-emitting layer 140, and the second semiconductor layer 150 is removed to make the isolation trenches, thereby to expose the uneven shape 111 of the uneven substrate 110. Thus, a part of the uneven shape 111 is exposed in the periphery O1 of the uneven substrate 110. That is, the exposed portion E1 is exposed. The exposed portion E1 has a shape of a rectangular window frame.

3-15. Third Distributed Bragg Reflector Formation Step (Third Insulating Film Formation Step)

A third distributed bragg reflector DBR3 is formed on the n-contact electrode N1, the first p-wiring electrode P2, and the exposed portion E1 of the substrate 110. The technique of formation may be sputtering or vapor deposition. In this step, the third distributed bragg reflector DBR3 covering the side surface of the base layer 120, a part of the side surface of the first semiconductor layer 130, and an exposed surface of the second distributed bragg reflector DBR2 is formed. Also, the third distributed bragg reflector DBR3 is formed so as to cover the periphery O1 which is the exposed portion E1 of the uneven shape 111 of the uneven substrate 110. In this step, the side surfaces 110c of the uneven substrate 110 are not covered by the third distributed bragg reflector DBR3.

3-16. Second p-Wiring Electrode Formation Step

A second p-wiring electrode P3 a part of which is contacted with the first p-wiring electrode P2 is formed on the third distributed bragg reflector DBR3. An n-wiring electrode N2 a part of which is contacted with the n-contact electrode N1 is formed on the third distributed bragg reflector DBR3. For that purpose, a part of the third distributed bragg reflector DBR3 is removed by etching using a mask to thereby expose a contact region of the first p-wiring electrode P2 and a contact region of the n-contact electrode N1. A second p-wiring electrode P3 is formed on the third distributed bragg reflector DBR3 to be contacted with the first p-wiring electrode P2 on the exposed contact region. An n-wiring electrode N2 is formed on the third distributed bragg reflector DBR3 to be contacted with the re-contact electrode N1 on the exposed contact region.

3-17. Pad Electrode Formation Step

A p-pad electrode PA is formed on the second p-wiring electrode P3. An n-pad electrode NA is formed on the n-wiring electrode N2.

3-18. Other Steps

In addition to the aforementioned steps, additional steps such as a heat treatment step may be carried out. In this way, the light-emitting device 100 shown in FIG. 1 is produced.

4. Brightness of Light-Emitting Device According to First Embodiment

Table 1 shows how brightness changes depending on whether or not the entire exposed portion E1 having the uneven shape 111 of the uneven substrate 110 of the first embodiment is covered by the DBR. Example 1 of Table 1 shows the total radiant flux of the light-emitting device 100 having the first distributed bragg reflector DBR1, the second distributed bragg reflector DBR2, and the third distributed bragg reflector DBR3.

Example 2 of Table 1 shows the total radiant flux of the light-emitting device in which the third distributed bragg reflector DBR3 covers the entire exposed portion E1 having the uneven shape 111 of the uneven substrate 110. In Example 2, the films corresponding to the first distributed bragg reflector DBR1 and the second distributed bragg reflector DBR2 are a simple insulating multilayer film that is not a DBR.

In Comparative Example of Table 1, all the films corresponding to the first distributed bragg reflector DBR1, the second distributed bragg reflector DBR2, and the third distributed bragg reflector DBR3 are merely an insulating multilayer film that is not a DBR.

As shown in Table 1, when one of the DBRs covers the semiconductor layer and the entire exposed portion E1 of the uneven substrate 110, and is fixed by the uneven shape 111 formed on the entire exposed portion E1 of the uneven substrate 110, the total radiant flux Po of the light-emitting device is improved by approximately 4%. That is, when the entire exposed portion E1 of the uneven substrate 110 and the side surfaces of the element except for the side surfaces 110c of the uneven substrate 110 are covered by any one of the DBRs, the total radiant flux Po is improved.

TABLE 1

|  | Total radiant flux Po |
| --- | --- |
| Example 1 | 1.04 |
| Example 2 | 1.04 |
| Comparative Example | 1.00 |

5. Variations 5-1. Simple Insulating Multilayer Film

The light-emitting device 100 according to the embodiment has a three-layer distributed bragg reflector of the first distributed bragg reflector DBR1, the second distributed bragg reflector DBR2, and the third distributed bragg reflector DBR3. However, at least one layer of three insulating layers may be a DBR covering the semiconductor layer as long as the DBR is formed on the uneven shape 111 of the entire exposed portion E1 of the uneven substrate 110. Thereby, adhesion between the DBR and the uneven substrate 110 is improved, and the brightness of the light-emitting device is also improved. In a case that the first distributed bragg reflector DBR1 and the second distributed bragg reflector DBR2 as well as the third distributed bragg reflector DBR3 are formed on the entire exposed portion E1 of the uneven substrate 110, the DBR1 and DBR2 are formed after the isolation trenches are formed. In a case that the second distributed bragg reflector DBR2 as well as the third distributed bragg reflector DBR3 is formed on the entire exposed portion E1 of the uneven substrate 110, the DBR2 is formed after the isolation trenches are formed.

5-2. Deposition Structure of Insulating Multilayer Film

In the embodiment, the insulating multilayer film has three layers. However, the insluting multilayer film may have one layer or two layers. The insulting multilayer film may have 4 layers or more. Even in that case, at least one layer of the insulating multilayer film is a DBR. The DBR covers the semiconductor layer and the uneven shape 111 in the periphery O1, i.e., the entire exposed portion E1, of the uneven substrate 110. Thereby, adhesion between the DBR and the uneven substrate 110 is improved, and the brightness of the light-emitting device is also improved.

5-3. Thickness of DBR

The total thickness of the first distributed bragg reflectors DBR1 is preferably larger than the total thickness of the third distributed bragg reflectors DBR3. That is, the total number of the layers in the first distributed bragg reflectors DBR1 is preferably larger than the total number of the layers in the third distributed bragg reflectors DBR3. Thereby, light absorption by the electrode can be suitably suppressed. Light emitted from the light-emitting layer 140 can be more effectively reflected.

5-4. Deposition Order of DBR

When the first distributed bragg reflector DBR1 or the like is formed by repeatedly depositing $SiO_2$ and $TiO_2$, $SiO_2$ is preferably deposited first. It is because the refractive index of $SiO_2$ is smaller than the refractive index of $TiO_2$.

5-5. Type of Semiconductor Layer

In the embodiment, Group III-V nitride semiconductor is described as an example. However, the type of semiconductor layer is not limited to Group III-V nitride semiconductor. Any other type of semiconductor material may be used.

5-6. Deposition Structure

The first conduction type first semiconductor layer 130 may be formed directly on the uneven shape 111 of the uneven substrate 110 without forming the base layer 120. Even in this case, the first conduction type first semiconductor layer 130 remains disposed between the uneven substrate 110 and the light-emitting layer 140.

5-7. Combinations

The aforementioned variations may be combined with one another without any restriction.

6. Summary of the Embodiment

As described above, the light-emitting device 100 of the embodiment is of a flip-chip type. At least one of the DBRs covers at least a part of the semiconductor layer and the uneven shape 111 in the periphery O1 of the uneven substrate 110. Therefore, the DBR is hardly peeled from the uneven substrate 110. The light-emitting device 100 is brighter than the conventional light-emitting device.

A. Note

In a first aspect of the present techniques, there is provided a semiconductor light-emitting device, the light-emitting device including an uneven substrate having an uneven shape on a first surface thereof, a first conduction type first semiconductor layer on the uneven shape of the uneven substrate, a light-emitting layer on the first semiconductor layer, a second conduction type second semiconductor layer on the light-emitting layer, and a DBR covering at least a part of the first semiconductor layer, the light-emitting layer, and the second semiconductor layer. The semiconductor light-emitting device is of a flip-chip type. The outer periphery of the uneven substrate has an exposed portion exposed without being covered by the first semiconductor layer. The DBR covers at least a part of the exposed portion of the uneven shape.

A second aspect of the present techniques is directed to a specific embodiment of the semiconductor light-emitting device, wherein the DBR does not cover the side surfaces of the uneven substrate.

In a third aspect of the present techniques, there is provided a method for producing a semiconductor light-emitting device, the semiconductor light-emitting device production method comprising the steps of preparing an uneven substrate having an uneven shape on a first surface, forming a first conduction type first semiconductor layer on the uneven shape of the uneven substrate, forming a light-emitting layer on the first semiconductor layer, forming a second conduction type second semiconductor layer on the light-emitting layer, and forming a DBR covering at least a part of the first semiconductor layer, the light-emitting layer, and the second semiconductor layer. The semiconductor light-emitting device is of a flip-chip type. The production method includes the step of exposing the uneven shape of the uneven substrate by removing a part of the first semiconductor layer, the light-emitting layer, and the second semiconductor layer. In the DBR formation step, the DBR is formed so as to cover at least a part of the exposed portion of the uneven shape of the uneven substrate.

A fourth aspect of the present techniques is directed to a specific embodiment of the semiconductor light-emitting device production method, wherein in the DBR formation step, the DBR is formed without covering the side surfaces of the uneven substrate.

What is claimed is:

1. A semiconductor light-emitting device comprising:
   an uneven substrate having an uneven shape on a first surface thereof;
   a first conduction type first semiconductor layer on the uneven shape of the uneven substrate;
   a light-emitting layer on the first semiconductor layer;
   a second conduction type second semiconductor layer on the light-emitting layer;
   a transparent electrode formed on the second conduction type second semiconductor layer;
   a first distributed bragg reflector formed on the transparent electrode;
   a p-contact electrode formed on the first distributed bragg reflector and contacting with the transparent electrode via a window formed in the first distributed bragg reflector;
   a second distributed bragg reflector formed on the p-contact electrode;
   a first p-wiring electrode formed on the second distributed bragg reflector and contacting with the p-contact electrode via a window formed in the second distributed bragg reflector;
   an n-contact electrode formed on the second distributed bragg reflector and contacting with the first conduction type first semiconductor layer; and
   a third distributed bragg reflector formed on the first p-wiring electrode and the n-contact electrode, wherein
   the semiconductor light-emitting device is of a flip-chip type;
   in an outer periphery of the uneven substrate, the uneven shape has an exposed portion exposed without being covered by the first semiconductor layer, and
   at least one of the first distributed bragg reflector, and second distributed bragg reflector, and the third distributed bragg reflector covers at least a part of the exposed portion of the uneven shape.

2. The semiconductor light-emitting device according to claim 1, wherein the semiconductor light-emitting device further comprises:
   a second p-wiring electrode formed on the third distributed bragg reflector and contacting with the first p-wiring electrode via a window formed in the third distributed bragg reflector;
   an n-wiring electrode formed on the third distributed bragg reflector and contacting with the n-contact electrode via a window formed in the third distributed bragg reflector;
   a p-pad electrode formed on the third distributed bragg reflector and the second p-wiring electrode; and
   an n-pad electrode formed on the third distributed bragg reflector and the n-wiring electrode.

3. The semiconductor light-emitting device according to claim 1, wherein the third distributed bragg reflector contacts with the exposed portion of the uneven shape.

4. The semiconductor light-emitting device according to claim 2, wherein the third distributed bragg reflector contacts with the exposed portion of the uneven shape.

5. The semiconductor light-emitting device according to claim 1, wherein the semiconductor light-emitting device further comprises an isolation trench, and wherein only the third distributed bragg reflector among the first distributed bragg reflector, the second distributed bragg reflector, and the third distributed bragg reflector is contacted with a side of the isolation trench.

6. The semiconductor light-emitting device according to claim 2, wherein the semiconductor light-emitting device further comprises an isolation trench, and wherein only the third distributed bragg reflector among the first distributed bragg reflector, the second distributed bragg reflector, and the third distributed bragg reflector is contacted with a side of the isolation trench.

7. The semiconductor light-emitting device according to claim 3, wherein the semiconductor light-emitting device further comprises an isolation trench, and wherein only the third distributed bragg reflector among the first distributed bragg reflector, the second distributed bragg reflector, and the third distributed bragg reflector is contacted with a side of the isolation trench.

8. The semiconductor light-emitting device according to claim 4, wherein the semiconductor light-emitting device further comprises an isolation trench, and wherein only the third distributed bragg reflector among the first distributed bragg reflector, the second distributed bragg reflector, and the third distributed bragg reflector is contacted with a side of the isolation trench.

9. The semiconductor light-emitting device according to claim 1, wherein the distributed bragg reflector does not cover the side surfaces of the uneven substrate.

10. The semiconductor light-emitting device according to claim 3, wherein the third distributed bragg reflector does not cover the side surfaces of the uneven substrate.

11. The semiconductor light-emitting device according to claim 7, wherein the third distributed bragg reflector does not cover the side surfaces of the uneven substrate.

* * * * *